US 6,665,930 B2

United States Patent
Matuschik

(10) Patent No.: US 6,665,930 B2
(45) Date of Patent: *Dec. 23, 2003

(54) PRINTED CIRCUIT BOARD WITH SMD COMPONENTS

(75) Inventor: Peter Matuschik, Duisburg (DE)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/261,844

(22) Filed: Mar. 3, 1999

(65) Prior Publication Data

US 2002/0029904 A1 Mar. 14, 2002

(30) Foreign Application Priority Data

Mar. 4, 1998 (DE) .......................... 198 09 138

(51) Int. Cl.⁷ ................................ H05K 3/46
(52) U.S. Cl. .................... 29/840; 29/842; 29/843; 29/845; 174/260; 174/263; 361/773
(58) Field of Search .................. 29/840, 842, 843, 29/845, 883; 174/260, 265, 267, 263; 361/773

(56) References Cited

U.S. PATENT DOCUMENTS

| | | | | |
|---|---|---|---|---|
| 3,346,774 A | * | 10/1967 | Brady | |
| 3,747,210 A | * | 7/1973 | Kroll | 29/630 R |
| 4,345,300 A | * | 8/1982 | Stuckey | 361/386 |
| 4,641,426 A | * | 2/1987 | Hartman et al. | 29/839 |
| 4,684,203 A | * | 8/1987 | Bihler | 439/751 |
| 4,775,917 A | * | 10/1988 | Eichhorn et al. | |
| 4,842,184 A | * | 6/1989 | Miller, Jr. | 228/180.1 |
| 4,871,317 A | * | 10/1989 | Jones | |
| 4,871,583 A | * | 10/1989 | Monnier | |
| 4,883,435 A | * | 11/1989 | Seidler | 439/876 |
| 4,982,376 A | * | 1/1991 | Mergens et al. | 361/400 |
| 5,029,748 A | * | 7/1991 | Lauterbach et al. | |
| 5,092,035 A | * | 3/1992 | McMichen et al. | 29/845 |
| 5,435,481 A | * | 7/1995 | Da Costa Alves et al. | |
| 5,476,399 A | * | 12/1995 | Porter | |
| 5,692,297 A | * | 12/1997 | Noda | |
| 5,937,514 A | * | 8/1999 | Li | 29/840 |
| 2002/0029904 A1 | * | 3/2002 | Matuschik | 174/263 |

FOREIGN PATENT DOCUMENTS

| | | |
|---|---|---|
| DE | 1902320 | 1/1971 |
| DE | 1241234 | 8/1971 |
| DE | 3420497 A1 | 1/1985 |
| EP | 0287111 A2 | 10/1988 |
| WO | 9746060 A1 | 4/1997 |

* cited by examiner

Primary Examiner—Carl J. Arbes
Assistant Examiner—Minh Trinh
(74) Attorney, Agent, or Firm—Steven R. Biren

(57) ABSTRACT

A printed circuit board with SMD components electrically connected to the printed circuit board by means of a reflow soldering process. In order to provide the printed circuit board with connection elements which can be mounted at minimal cost, the printed circuit board is provided with one or more connection elements for making an electric connection to other electric components. These connection elements are journaled in recesses of the printed circuit board and do not project to the exterior via the surface of the printed circuit board on which the SMD components are secured.

18 Claims, 2 Drawing Sheets

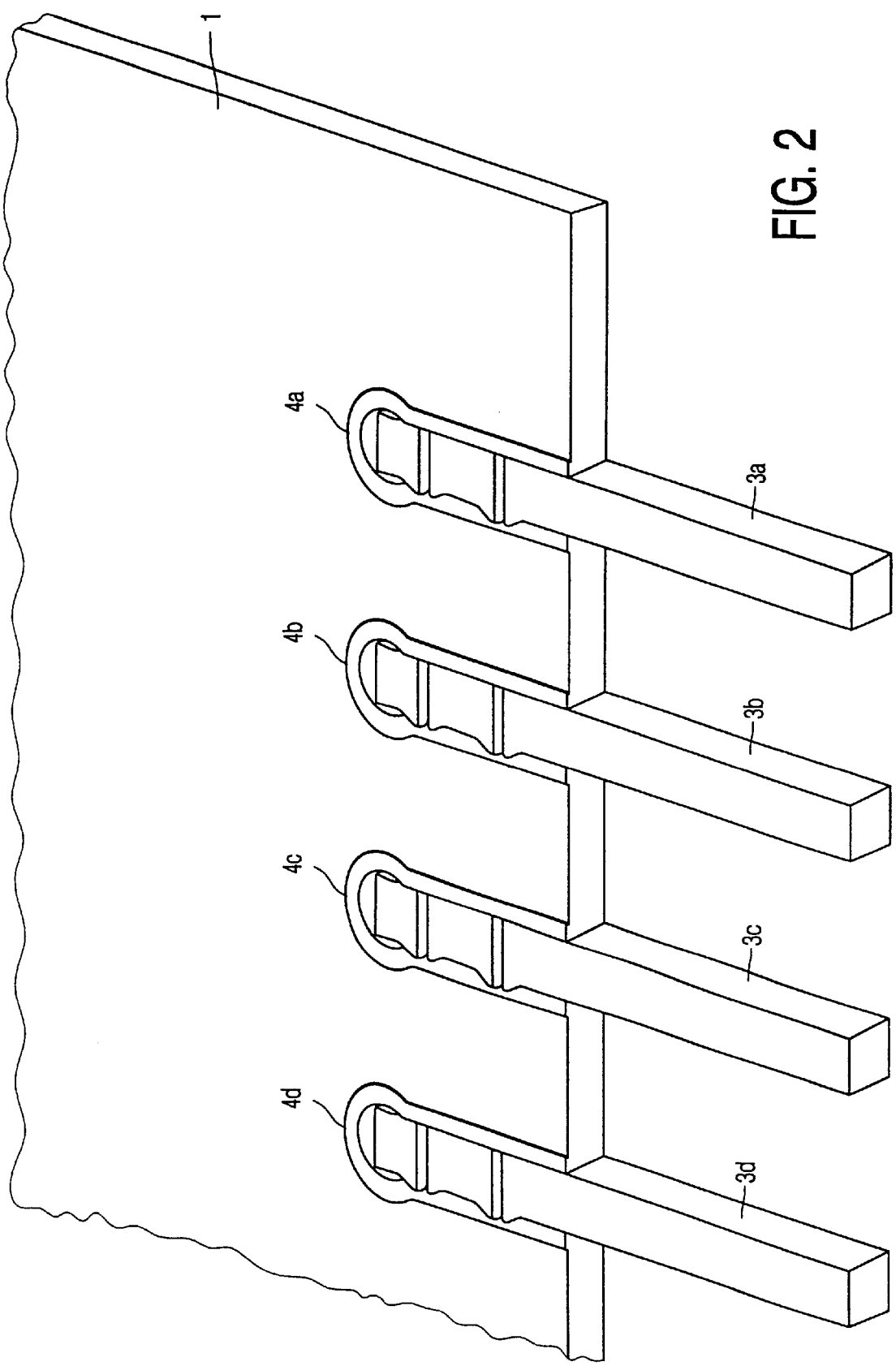

PRINTED CIRCUIT BOARD WITH SMD COMPONENTS

BACKGROUND OF THE INVENTION

This invention relates to a printed circuit board with SMD components electrically connected to the circuit board by means of a reflow soldering process. The invention also relates to an electrical apparatus including such a printed circuit board and to a method of manufacturing a printed circuit board.

SMD components are mounted on the surface of printed circuit boards ("Surface Mounted Device"). In the assembly of the printed circuit board, soldering paste is first provided in a predetermined pattern on the printed circuit board by means of a silk-screening method. Subsequently, the SMD components are mounted on the printed circuit board and possibly fixed to the surface of the printed circuit board by means of a non-conducting adhesive, the component connections coming into contact at the predetermined positions with the soldering paste patterns printed on the printed circuit board. The components themselves and their connections are situated on the same side of the printed circuit board. Subsequently, the reflow soldering process (a flow soldering process) is performed. The solder provided on the printed circuit board is melted by way of a heat supply from an appropriate furnace, so that fixed electric soldering connections between the SMD components and the printed circuit board are formed.

Connection elements are required for realizing electric connections to other electric components, for example, other printed circuit boards or internal connections of electrical apparatuses. Known embodiments are connection pins or pin strips embedded in synthetic material blocks which, together with the SMD components, are mounted on the printed circuit board after the soldering paste has been provided. It is a drawback in this case that the synthetic material requires additional space on the printed circuit board and that additional costs are involved, while this synthetic material cannot be liquified at the high temperatures during the reflow soldering process. The additional costs are quite considerable, particularly in mass production. In alternative methods, separate connection elements (for example, connection pins) are manually soldered onto the printed circuit board after the reflow soldering process, which involves additional labor costs.

SUMMARY OF THE INVENTION

It is an object of the invention to provide a printed circuit board having connection elements which can be mounted at minimal cost.

This object is achieved in that the printed circuit board has one or more connection elements used for an electric p connection to other electric components, which connection elements are journaled in recesses of the printed circuit board and do not project to the exterior via the surface of the printed circuit board on which the SMD components are secured.

Mounting of the connection elements, particularly implemented as connection pins, may thus be integrated in the automated process of manufacturing the printed circuit board. The connection elements are arranged in the printed circuit board in such a way that the soldering paste can be provided between the connection elements and the printed circuit board by means of a silk-screening process. This can be particularly realized in that the connection elements do not project to the exterior via the surface of the printed circuit board on which the SMD components are fixed.

When the connection elements are arranged in a peripheral area of the printed circuit board, the printed circuit board may be implemented in a very simple way by recesses in the peripheral area for engaging and journaling the connection elements. Such recesses can be made by way of, for example, punching or milling processes. To ensure a fixed fit of the connection elements already before and during the soldering process, the connection elements are pressed into the recesses, which may be performed in an automated process.

The invention also relates to an electrical apparatus including a printed circuit board according to the invention. For example, the printed circuit board may be used in electrical apparatuses for consumer electronics. However, its field of application is not limited to such uses. The printed circuit board according to the invention is preferably used in mass-manufactured electrical apparatuses.

The invention also relates to a method of manufacturing a printed circuit board with SMD components which are electrically connected to the printed circuit board by means of a reflow soldering process, in which, prior to providing the soldering paste used for the reflow soldering process, one or more connection elements, used for an electric connection to other electric components, are arranged at the appropriate positions in the printed circuit board. Subsequently, the connection elements are connected to the printed circuit board by means of the reflow soldering process. The advantages which can be achieved by means of this manufacturing method are defined in the above-mentioned implementations.

These and other aspects of the invention are apparent from and will be elucidated with reference to the embodiments described hereinafter.

BRIEF DESCRIPTION OF THE DRAWINGS

In the drawings:

FIG. 2 shows the embodiment of FIG. 1, with the connection elements inserted into the printed circuit board.

DESCRIPTION OF THE PREFERRED EMBODIMENTS

Figure 1:
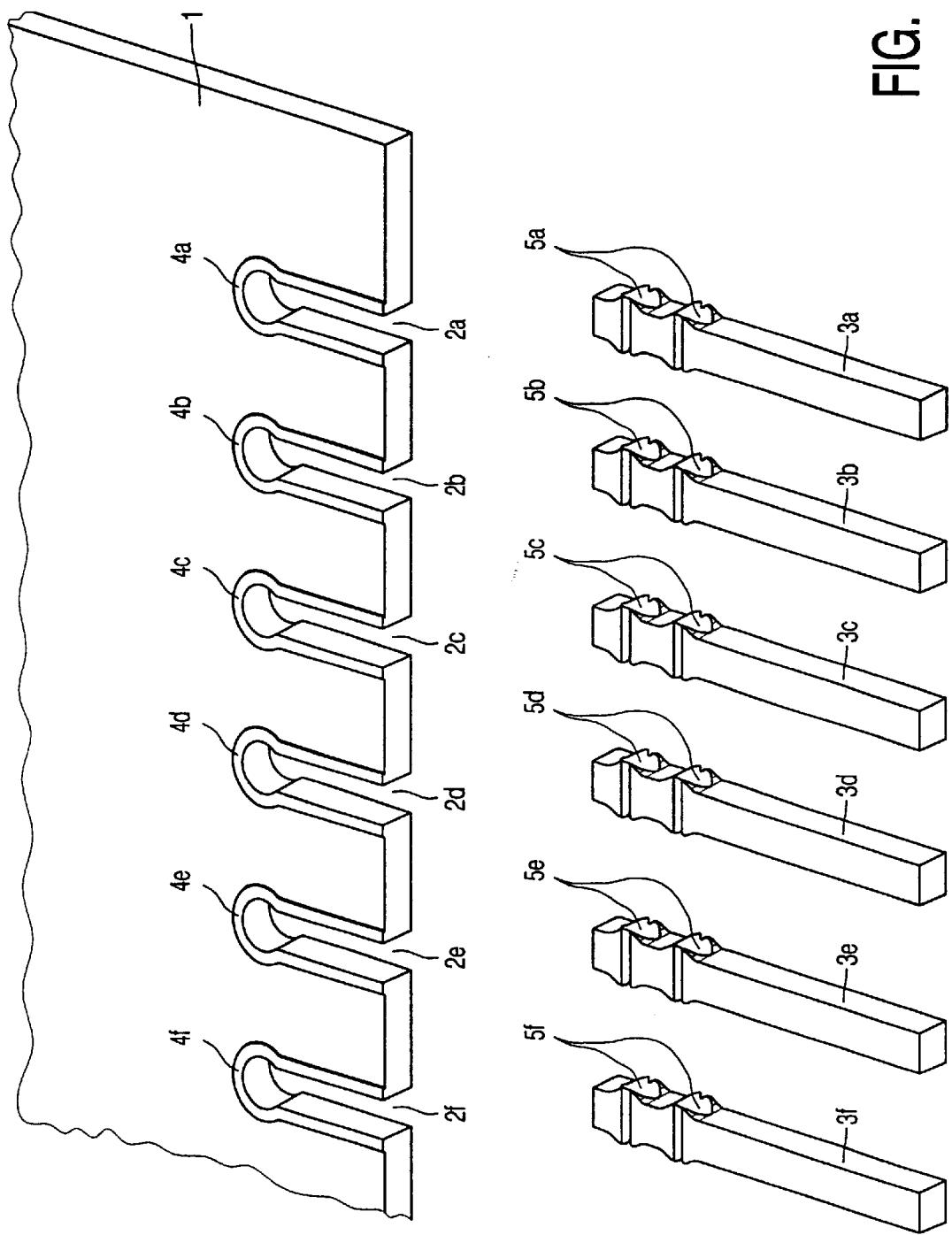
FIG. 1 shows a printed circuit board with connection elements in the unconnected state.

The printed circuit board 1 shown in the FIGS. is used for accommodating SMD components (not shown) so as to realize an electric circuit. Only a section of the printed circuit board 1 is shown, because this is sufficient for describing the invention. The lower peripheral area of the printed circuit board 1 has recesses 2a, 2b, . . . , 2f for engaging connection elements 3a, 3b, . . . , 3f implemented as connection pins. The recesses 2a to 2f consist of slots extending from the lower edge of the printed circuit board 1 perpendicularly into the central part of the printed circuit board and terminating in apertures at their ends in the central part of the printed circuit board 1. The recesses 2a to 2f are obtained by means of, for example, a punching process. They may be alternatively obtained by milling the slots of the recesses in the printed circuit board 1 and by drilling or punching the holes.

The connection elements 3a to 3f are used for realizing an electric connection to other electric components (not shown), for example, other components (for example, integrated circuit boards) of an electrical apparatus.

In the manufacture of the printed circuit board 1, the recesses 2a to 2f are first formed in the printed circuit board 1 in a first process step, as described above. The recesses 2a to 2f are provided with electrically conducting coatings 4a to 4f (of, for example, copper) in the adjoining area of the printed circuit board 1 so as to ensure a safe electrical contact with the connection elements 3a to 3f. The connection elements 3a to 3f are then pressed into the recesses 2a to 2f by means of an automated process. To ensure a secure fit of the connection elements 3a to 3f in the recesses 2a to 2f, the connection pins have wider portions 5a to 5f which are pressed into the printed circuit board during the pressing process. To give the connection elements 3a to 3f an even stronger fit, a subsequent process in which the connection elements 3a to 3f are notched at the areas of the wider portions 5a to 5f may be carried out.

In a second step, a soldering paste pattern is formed on the printed circuit board 1 by means of a conventional silk-screening process. Soldering paste is also provided on the printed circuit board 1 in the peripheral area of the recesses 2a to 2f, so that an electric connection of the connection pins 3a to 3f to the conductor tracks to be generated by the soldering paste can be ensured. Since the connection elements 3a to 3f do not project to the exterior via the surface of the printed circuit board, the silk-screening process for the soldering paste pattern with connection elements 3a to 3f inserted into the printed circuit board 1 can be carried out.

In a third step, the SMD components are mounted on the printed circuit board 1. To ensure a secure fit of the components on the printed circuit board 1 for subsequent processing of the printed circuit board 1, the components are preferably glued to the printed circuit board 1 by means of an adhesive.

In a fourth step, the printed circuit board 1 is introduced into a furnace. The furnace is usually heated to temperatures of more than 240 C. Due to the supplied thermal energy, the solder contained in the soldering paste is flow-melted. A circuit structure on the printed circuit board 1 is then produced in the conventional manner. In the printed circuit board 1 according to the invention, the solder connections are now also provided between the connection elements 3a to 3f and the circuit structure on the printed circuit board 1. The solder of the soldering paste provided in the peripheral area of the recesses 4a to 4f flows into the gaps between the connection elements 3a to 3f and the boundary faces of the printed circuit board bounding the recesses 4a to 4f, on which the coatings 4a to 4f have been provided.

What is claimed is:

1. A method of manufacturing a printed circuit board having SMD components on a surface thereof and which are electrically connected to the printed circuit board by means of a reflow soldering process, comprising; forming recesses in the circuit board, arranging in said recesses one or more connection elements that are each formed with two or more wider portions, each portion having one or more transverse notches, said connection elements adapted for electrically connecting to other electric components and configured such that the connection elements wider portions and notches snugly insert into respective recesses and do not project above said surface of said printed circuit board.

2. The manufacturing method as claimed in claim 1 wherein said recesses in the circuit board are located in a peripheral area of the printed circuit board.

3. The manufacturing method as claimed in claim 2 further comprising the step of providing soldering paste in a soldering paste pattern on the surface of the printed circuit board by means of a silk-screening process.

4. The manufacturing method of claim 3 wherein the step of providing the soldering paste further comprises depositing the soldering paste on the surface of the printed circuit board in a peripheral area of the recesses.

5. The manufacturing method as claimed in claim 1 wherein the step of providing the soldering paste comprises forming a soldering paste pattern on the surface of the printed circuit board by means of a silk-screening process.

6. The manufacturing method as claimed in claim 1 wherein the step of arranging the connection elements in the recesses of the printed circuit board comprises press fitting the connection elements into said recesses in the printed circuit board.

7. The manufacturing method as claimed in claim 1 wherein the recesses extend inwardly from a peripheral area of the printed circuit board and terminate in a wider opening at interior ends of the recesses in the printed circuit board, and the connection elements comprise connection pins having a wider area at one end thereof adapted to mate with said wider opening in the recesses of the printed circuit board.

8. The manufacturing method as claimed in claim 7 wherein the notches are formed at wider areas of the connection pins.

9. The manufacturing method as claimed in claim 2 wherein the recesses comprise slots which extend inwardly from the peripheral area of the printed circuit board in directions perpendicular to the peripheral area of the printed circuit board and terminate in apertures in the printed circuit board.

10. The manufacturing method as claimed in claim 1 wherein the method includes arranging the connection elements in said recesses prior to providing on the surface of the printed circuit board the soldering paste used for the reflow soldering process.

11. A method of manufacturing a printed circuit board having SMD components on a surface thereof and which are electrically connected to the printed circuit board by means of a reflow soldering process, comprising; forming recesses in the circuit board, arranging in said recesses one or more connection elements that are each formed with one or more transverse notches, said connection elements adapted for electrically connecting to other electric components and configured such that the connection elements notches snugly insert into respective recesses and do not project above said surface of the printed circuit board and providing on said surface a soldering paste wherein an adhesive substance connects the SMD components to the printed circuit board, and wherein the method includes a heating step during which the printed circuit board is heated to a temperature greater the 240° so as to flow melt the soldering paste.

12. The manufacturing method as claimed in claim 11 wherein the step of providing the soldering paste comprises depositing the soldering paste on the surface of the printed circuit board in a peripheral area of the recesses.

13. The manufacturing method as claimed in claim 11 wherein the step of providing the soldering paste comprises forming a soldering paste pattern on the surface of the printed circuit board by means of a silk-screening process.

14. The manufacturing method as claimed in claim 11 wherein the step of arranging the connection elements in the recesses of the printed circuit board comprises press fitting the connection elements into said recesses in the printed circuit board.

15. The manufacturing method as claimed in claim 11 wherein the recesses extend inwardly from a peripheral area of the printed circuit board and terminate in a wider opening at interior ends of the recesses in the printed circuit board, and the connection elements comprise connection pins having a wider area at one end thereof adapted to mate with said wider opening in the recesses of the printed circuit board.

16. The manufacturing method as claimed in claim 11 wherein the notches are formed at the wider areas thereof.

17. The manufacturing method as claimed in claim 11 wherein the method includes arranging the connection elements in said recesses prior to providing on the surface of the printed circuit board the soldering paste used for the reflow soldering process.

18. A method of manufacturing a printed circuit board with SMD components which are electrically connected to the printed circuit board by means of a reflow soldering process, comprising:

prior to providing a soldering paste used for the reflow soldering process, arranging one or more connection elements with two transversely notched widened areas at ends inserted into the recesses, the connection elements used for electrically connecting to other electric components of the printed circuit board and configured so that they do not project above a surface of the printed circuit board on which the SMD components are mounted;

during providing a soldering paste by means of a silk-screening process, also providing soldering paste in a peripheral area of the recesses; and during the reflow soldering process, flow-melting the solder contained in the soldering paste so that solder connections are produced between the connection elements and a circuit structure of the printed circuit board.

* * * * *